United States Patent [19]

Allaroyce et al.

[11] 4,329,648
[45] May 11, 1982

[54] METHOD OF CHECKING FOR ELECTRICAL FRIT BREAKDOWN IN KINESCOPES AND APPARATUS THEREFOR

[75] Inventors: Gerald M. Allaroyce, Avoca; Ronald N. Moskalczak, Jermyn; Edward A. Gronka, W. Nanicoke, all of Pa.

[73] Assignee: RCA Corporation, New York, N.Y.

[21] Appl. No.: 170,815

[22] Filed: Jul. 21, 1980

[51] Int. Cl.³ .......................................... G01R 31/024
[52] U.S. Cl. ........................................ 324/404; 324/72
[58] Field of Search ........................................ 324/404

[56] References Cited

U.S. PATENT DOCUMENTS

| | | | |
|---|---|---|---|
| 2,582,822 | 1/1952 | Evans | 324/404 |
| 2,637,005 | 4/1953 | Hood et al. | 324/404 |
| 2,860,302 | 11/1958 | De Gier | 324/404 |
| 2,978,637 | 4/1961 | Price et al. | |
| 3,417,327 | 12/1968 | Breidenbach | |

*Primary Examiner*—Michael J. Tokar
*Attorney, Agent, or Firm*—Eugene M. Whitacre; Glenn H. Bruestle; Lester L. Hallacher

[57] ABSTRACT

A method for checking for electrical frit breakdown in kinescopes uses a novel probe which is dimensioned to enter into the neck of the kinescopes without contacting the interior of the neck. A movable electrical contact is actuated to a position against the conductive coating on the inside of the tube. A high voltage supply is connected between the movable contact and the frit seal and current flow indicates an electrical frit seal breakdown.

17 Claims, 5 Drawing Figures

METHOD OF CHECKING FOR ELECTRICAL FRIT BREAKDOWN IN KINESCOPES AND APPARATUS THEREFOR

BACKGROUND OF THE INVENTION

This invention relates generally to the testing of kinescopes during production and particularly to a method of and apparatus for testing for electrical breakdown of the frit seal of such tubes.

Kinescopes for television include a funnel, a neck and a faceplate. Typically, the funnel and neck are integrally fabricated with the neck portion attached to the narrow end of the funnel. The faceplate is affixed to the wide end of the funnel by a fritting process which hermetically couples the two elements. The inside of the funnel and a portion of the neck are covered with a conductive coating which is biased with a high positive voltage during the operation of the tube to accelerate the electron beams toward the faceplate. A problem sometimes occurs with the frit seal when the electrical coating material diffuses into the fritting material or when contaminates on the funnel or faceplate render the frit seal electrically conductive making the tube unacceptable. Every envelope must, therefore, be checked for this condition prior to further processing.

Every kinescope is provided with an external terminal which is electrically connected to the internal conductive coating so that the coating can be positively biased. This terminal is called the P2, or anode button. In the prior art when testing for electrical frit breakdown, a potential in excess of the normal operating potential is applied to the anode button terminal. A conductive band is placed around the frit seal so that an electrical breakdown at any point along the seal is electrically coupled to the band. The band is then either grounded or connected to the negative side of the high voltage power supply. An electrical frit breakdown is then indicated by a current flow when the high voltage is applied. In some tubes, particularly those with smaller diagonals, such as 17 and 19 inches (43 and 48 cm), the spacing between the anode terminal and the frit seal is close and arcing occurs between the band and the connector which couples the high voltage to the anode terminal. Such arcing results in a current flow and thus is undistinguishable from a frit breakdown to the testing equipment so that good tubes appear to be failures.

The instant invention addresses this problem by the provision of a probe which is inserted into the neck of the kinescope so that the test voltage is applied directly to the inner conductive coating electrode through a movable contact. The possibility of arcing between the connector and the band around the frit seal is thus eliminated.

SUMMARY OF THE INVENTION

A probe for checking for frit breakdown in a kinescope tube includes an elongated member which is passed through the neck of the kinescope. A movable electrical contact supported by the elongated member is placed in the proximity of the conductive coating on the inside of the kinescope by inserting the elongated member through the kinescope neck. The contact is moved by appropriate means into electrical contact with the conductive coating to enable checking for electrical breakdown of the kinescope frit seal.

DETAILED DESCRIPTION OF THE INVENTION

Figure 1:
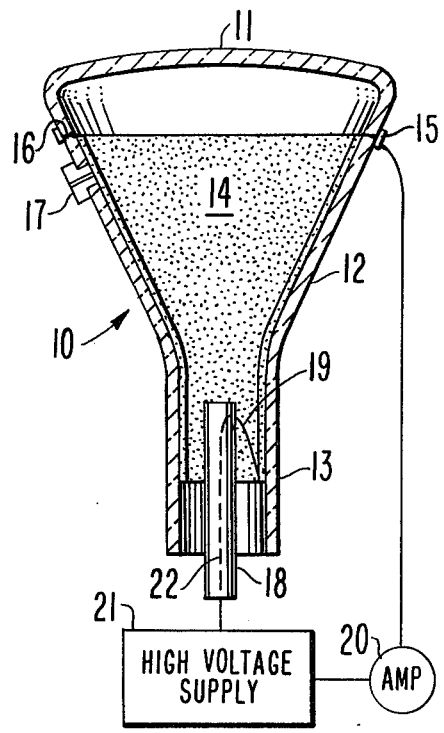
FIG. 1 is a cross-section of a kinescope showing the use of a probe and simplified circuitry to test for electrical breakdown of the frit seal.

FIG. 1 is a cross-section of a kinescope 10 including a faceplate 11, a funnel 12 and a neck 13. The inside of the funnel 12 and a portion of the neck 13 are made conductive by the application of a conductive coating 14. In fabricating the kinescope 10 the funnel 12 and neck 13 typically are made as an integral unit. The faceplate 11 is made as a separate unit which is hermetically affixed to the wide-end of the funnel by applying a fritting material between the edges of the faceplate and funnel and applying an appropriate heat to form a frit seal 16. A problem sometimes arises when the frit seal becomes conductive because of contaminates on the funnel or faceplate or because of diffusion of the conductive coating.

The instant invention is directed to a method of checking for electrical frit seal breakdown using a novel probe 18 which is inserted into the neck 13 of the kinescope 10 so that arcing between the anode terminal 17 and the frit seal is avoided. The probe 18 is dimensioned to leave a clearance along the neck 13 and has a length sufficient to reach the funnel 12, if desired. A movable electrical contact 19 is pivotably coupled to the probe 18 and is actuated by appropriate means to touch the conductive coating electrode 18 inside either the neck 13 or the funnel 12. A high voltage supply 21 is connected to the movable contact 19 by way of a conductor 22 which extends through the probe 18. The negative side of the high voltage supply 21 is connected to a conductive band 15 around the outside of the frit seal 16 through an ameter 20. Application of the high test voltage to the contact 19 therefore also energizes the electrode 14. Electrical breakdown of the frit seal 16 is indicated by current flow through the ameter 20. The test circuitry shown is exemplary only as many types of circuitry can be utilized within the preview of one skilled in the art.

Figure 2:
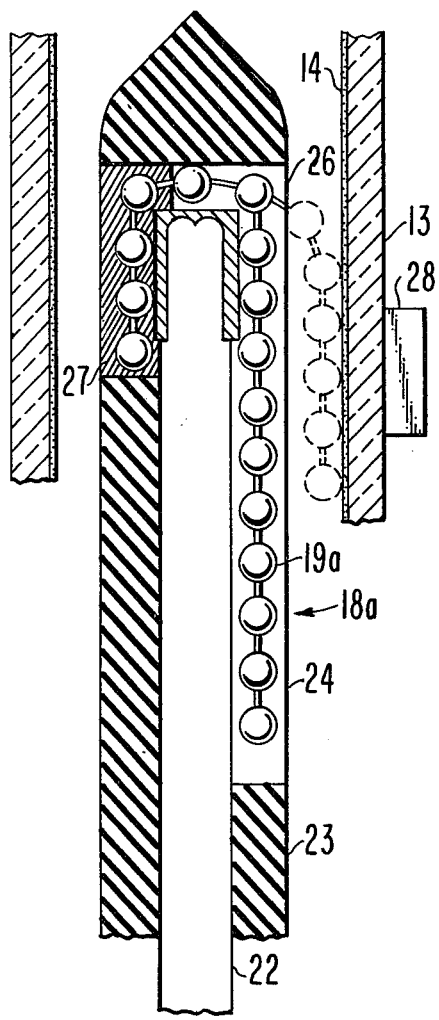
FIG. 2 is a cross-section of a preferred embodiment utilizing a bead chain as the movable contact.

In the preferred embodiment of FIG. 2, the probe 18a includes an insulative cylinder 23 which is coaxially hollowed to receive the conductor 22. The movable electrode is a ferromagnetic flexible conductive element, such as a bead chain 19a, which in a neutral position rests within an elongated slot 24. The electrode 19a passes through a radial slot 26 and is seated in a shorter longitudinal slot 27. A conductive material, such as solder or a conductive paste which gives good electrical contact affixes the electrode 19a to the conductor 22.

In use, the probe 18a is inserted into the neck 13 of the kinescope and a permanent or electromagnetic magnet 28 outside the neck 13 attracts the chain 19a against the conductive coating 14 as indicated by the broken lines. The high test voltage is applied to the movable electrode 19a through the conductor 22 in the manner shown in FIG. 1. The bead chain 19a is light and the beads are smooth so that the electrical coating 14 is not scratched or otherwise damaged. Additionally, the test uses high voltage and low current so that a light electrode 19a can be used for the test.

Figure 3:
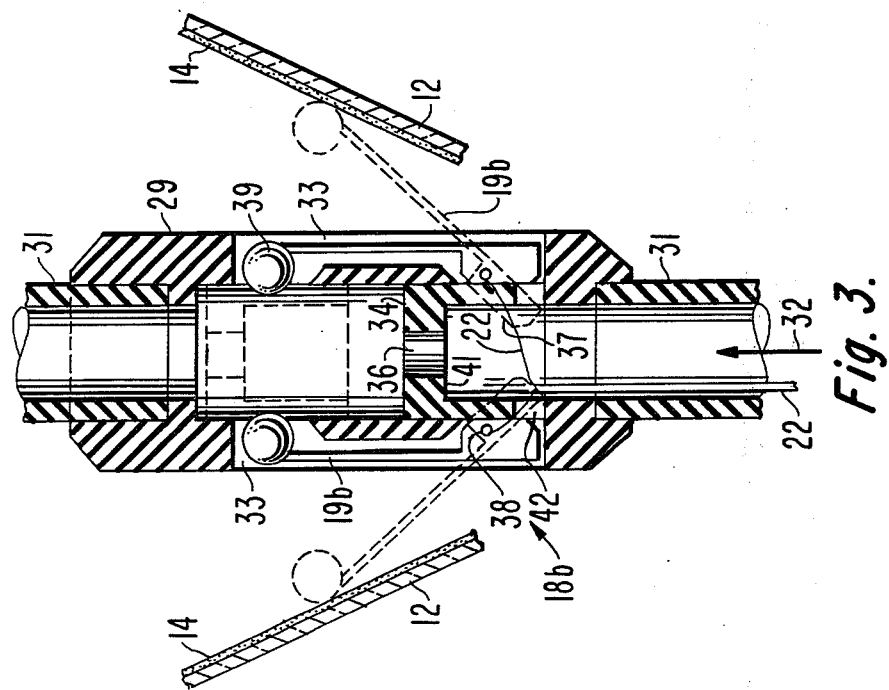
FIG. 3 is a preferred embodiment utilizing pivotable arms as the movable contact.

The FIG. 3 embodiment utilizes pivotable arms 19b as the movable contacts. The probe 18b includes an insulative cylindrical member 29 which is coaxially hollowed. The cylinder 29 is recessed at both ends to receive tubes 31 to admit air to the kinescope 10 through the cylinder 29 as indicated by the arrow 32. The air is used to purge the kinescope 10 of residue from the fritting process. The cylinder 29 includes two longitudinal slots 33 spaced at 180° in which the pivot arms 19b are pivotably retained. A slide 34 is coaxially arranged within the cylinder 29 and contains a centered aperture 36 through which air can flow. The pivot arms 19b have a flat surface 37 which rests against the slide 34 in the unactuated position. Spheres 39 are arranged at the free ends of the arms 19b and if desired can extend slightly beyond the inside of the cylinder 29 wall. The pivot points 38 of the arms 19a are displaced from the center arms 19b so that the weight of the spheres 39 tends to pivot the arms outwardly.

In the unactuated position, the slide 34 rests against the surfaces 37 to hold the contact arms 19b substantially parallel to the longitudinal axis of the cylinder 29. In the actuated position, indicated by dashed lines, air acts against the shoulder 41 within the slide 34 and moves the slide 34 to the raised position. The slide 34 no longer rests against the flat surfaces 37 of the arms 19a and the weight of the spheres 39 pivots the arms outwardly to contact the conductive coating 14. When the spheres 39 extend beyond the inner wall of the cylinder 29 the slide 34 contacts the spheres 39 pushing the arms 19b outwardly. Air flowing into the cylinder 29 also acts against the spheres 39 to move the contact arms 19b into the actuated position even when the spheres are not contacted by the slide 34. When the air supply is turned off the slide 34 returns to the unactuated position and acts against the surfaces 37 of the arms to return the arms to the unactuated position. The slide 34 contains apertures 42 through which the conductor 22 is connected to the pivot points 38 of the arms 19b.

Figure 4:
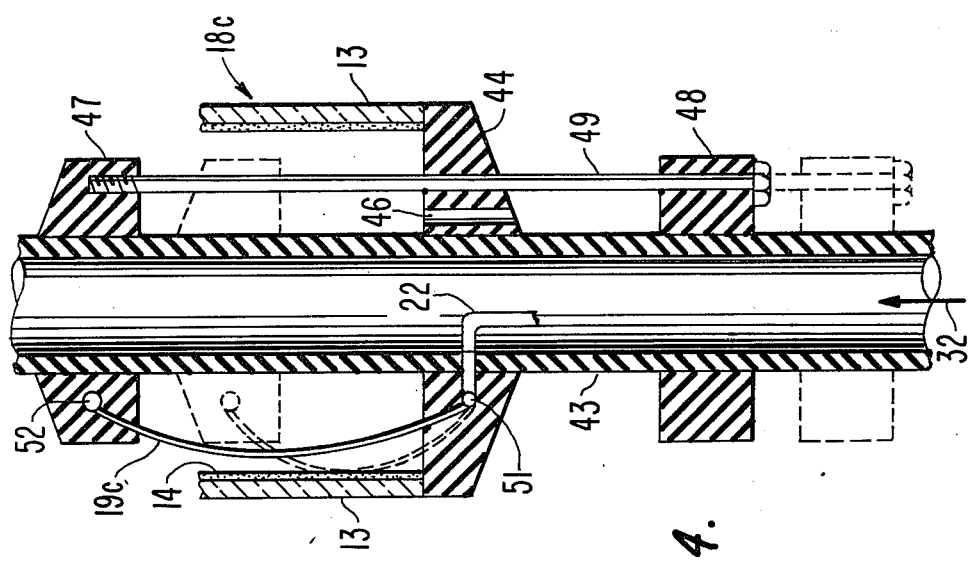
FIG. 4 is a preferred embodiment utilizing leaf springs as the movable contact.

The FIG. 4 embodiment uses leaf springs 19c as the movable electrical contacts. The probe 18c includes a hollow tube 43 through which flushing air, indicated by the arrow 32, is provided. A stop 44 is stationarily affixed to the tube 43. The stop 44 includes apertures 46 which allow the purging air to exit from the kinescope. The stop 44 acts against the end of the neck 13 of the envelope to stop the entrances of the probe 18c. Two slidable members 47 and 48 are coaxial about the tube 43 and are connected by tie rods 49. Typically, a plurality of the leaf springs 19c and tie rods 49 are equally spaced about the tube 43. FIG. 4 is a cross-section when three of each are used. The tie rods 49 slidably pass through the guide 44 so that the slide numbers 47 and 48 can slide as a unit with respect to the stop 44.

The leaf springs 19c are extended between the stop 44 and the slide 47 and are pivotably connected to the stop 44 and the slide 47 at the pivot points 51 and 52, respectively. The leaf springs 19c bias the slide number 47 into the neutral position shown. After the probe 18c is inserted into the neck 13 of the kinescope 10 a pulling force on the slide 48 causes the simultaneous movement of the slides 47 and 48 expanding the leaf springs 19c to the actuated dashed line position against the conductive coating 14. The conductor 22 is connected to all the leaf springs 19c at the pivot points 51.

Figure 5:
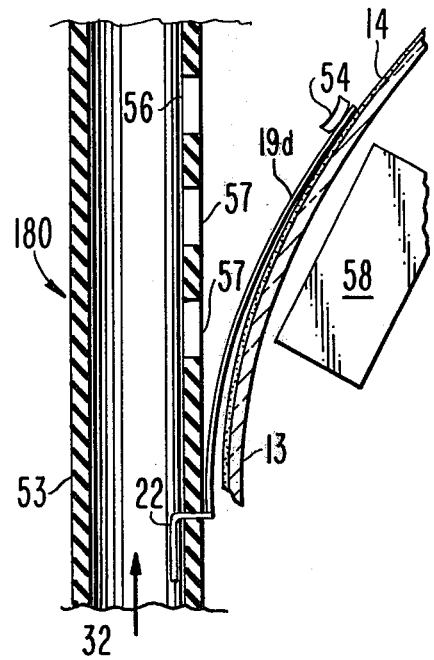
FIG. 5 is a preferred embodiment utilizing flexible metallic members as the movable contact.

The FIG. 5 embodiment uses resilient arms 19d as the movable electrical contacts. The probe 18d includes a hollow cylindrical tube 53 through which the flushing air 32 is admitted to the interior of the kinescope tube. Permanently affixed to the outside of the tube 53 is a plurality of electrically conductive resilient arms 19d, only one of which is shown. The arms 19d have sufficient resilience to naturally assume a position against the outside of the tube 53 substantially parallel to the longitudinal axis of the tube. Arranged at the free end of the resilient arms 19d is a pad 54 which in the unactuated position rests in an aperture 56 in the tube 53.

The resilient arm 19d can be moved to the actuated position against the conductive coating 14 in either of two ways. A plurality of apertures 57 along the side of the tube 53 permit air to pass out of the tube and act against the arms 19d. Alternatively, a permanent or an electromagnetic magnet 58 can be used to magnetically attract the resilient arms 19d into contact with the conductive coating 14. The high voltage source is connected to the fixed end of the resilient arms 19d through the conductor 22.

What is claimed is:

1. A probe for checking for electrical frit breakdown in kinescopes having an internal conductive coating in a funnel portion and a neck portion comprising:
    an elongated member cross-sectionally dimensioned to slip through said neck portion while remaining clear of said neck portion;
    movable electrical contact means carried by said elongated member so that said contact means can be placed in the proximity of said conductive coating by inserting said elongated member into said neck portion; and
    means for moving said electrical contact into electrical contact with said internal conductive coating.

2. The probe of claim 1 wherein said movable contact is a flexible conductive element.

3. The probe of claim 2 wherein said flexible element is ferromagnetic and said means for moving is a magnet arranged outside said kinescope.

4. The probe of claim 3 wherein said flexible element is a bead chain and wherein said elongated member is a cylinder including a longitudinal slot for receiving said chain and having a conductor electrically coupled to said chain.

5. The probe of claim 1 wherein said movable contact means includes at least one contact arm pivotably coupled to said insulative member.

6. The probe of claim 5 wherein said means for moving includes a slide member having a neutral position and an actuated position, said slide member supporting said contact arm substantially parallel to said insulative member when in said neutral position and freeing said contact arm to pivot against said internal coating when in said actuated position.

7. The probe of claim 6 wherein said elongated member is hollow and is capable of admitting air into said kinescope and wherein said slide member is moved from said neutral position to said actuated position by air flow into said kinescope.

8. The probe of claim 7 wherein said elongated member is a cylinder having at least one elongated aperture, said contact arm being arranged in said aperture, and wherein said slide is coaxially arranged in said cylinder.

9. The probe of claim 1 wherein said electrical contact means is at least one leaf spring and wherein said means for moving is a slide member, one end of said leaf spring being coupled to said slide member and the other end of said leaf spring being stationary with respect to said elongated member so that sliding of said slide member expands and contracts said leaf spring.

10. The probe of claim 9 wherein said elongated member is a cylinder having a stationary stop, and wherein said slide member includes two slides coaxial about said cylinder and spaced about said stop, said slides being coupled by tie rods and said leaf spring being arranged between said stop and one of said slides so that movement of said slides expands and contracts said springs.

11. The probe of claim 1 wherein said movable contact means is an elongated resilient member having one end affixed to said elongated member and having a neutral position substantially parallel to said elongated member and an actuated position angularly displaced from said insulative member.

12. The probe of claim 11 wherein said means for moving is a magnet.

13. The probe of claim 11 wherein said elongated member is a hollow cylinder for admitting air to said kinescope and wherein said resilient member is biased away from said cylinder by air flowing into said kinescope.

14. A method of checking for electrical breakdown of the frit seal between the faceplate and the funnel of a kinescope having a neck attached to the narrow end of the funnel, and having a conductive coating on the inside of the funnel and at least a portion of the neck including the steps of:

placing a conductive band around said frit seal;

inserting a probe into said kinescope through said neck while keeping said probe free from touching said neck and said kinescope;

connecting a high voltage source and a means for showing current flow between said band and said probe;

actuating a movable contact mounted on said probe so that said contact touches said conductive coating to complete electrical continuity from said band to said contact;

energizing said voltage source; and observing said means for showing current flow, a flow of current indicating an electrical breakdown of said frit seal.

15. The method of claim 14 wherein said movable contact is ferromagnetic and wherein said step of actuating includes the step of placing magnet on the outside of said kinescope to attract the movable contact to said conductive coating.

16. The method of claim 14 wherein said probe is a hollow cylinder having a slidable member coaxial therein and wherein said step of actuating includes the step of blowing air through said probe to move said slidable member and cause said contact to move to said conductive coating.

17. The method of claim 14 wherein said movable contact is mounted between a member fixed with respect to said probe and a member movable with respect to said probe and wherein said step of actuating includes sliding said movable member toward said fixed member until said contact touches said conductive coating.

* * * * *

UNITED STATES PATENT AND TRADEMARK OFFICE
CERTIFICATE OF CORRECTION

PATENT NO. : 4,329,648
DATED : May 11, 1982
INVENTOR(S) : Gerald M. Allardyce, Ronald N. Moskalczak, and Edward A. Gronka It is certified that error appears in the above—identified patent and that said Letters Patent is hereby corrected as shown below:

Cover page, in two places, First Inventor's Name "Allaroyce" should read --Allardyce--.

Signed and Sealed this

Twenty-second Day of June 1982

[SEAL]

Attest:

Attesting Officer

GERALD J. MOSSINGHOFF
Commissioner of Patents and Trademarks